(12) United States Patent
Chu

(10) Patent No.: US 7,709,418 B1
(45) Date of Patent: *May 4, 2010

(54) HIGH TRANSITION TEMPERATURE SUPERCONDUCTING COMPOSITIONS

(75) Inventor: Ching-Wu Chu, Houston, TX (US)

(73) Assignee: University of Houston, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 07/300,063

(22) Filed: Jan. 23, 1989

Related U.S. Application Data

(63) Continuation of application No. 07/102,205, filed on Feb. 6, 1987, now abandoned, which is a continuation-in-part of application No. 07/006,991, filed on Jan. 26, 1987, now abandoned, which is a continuation-in-part of application No. 07/002,089, filed on Jan. 12, 1987, now abandoned.

(51) Int. Cl.
*H01L 39/12* (2006.01)
*C04B 35/45* (2006.01)

(52) U.S. Cl. .................... 505/126; 505/780

(58) Field of Classification Search ........... 29/599; 252/518, 520, 521; 420/901; 423/263, 593; 428/930; 501/104, 108, 123, 126, 135, 152; 505/125, 126, 490, 500, 780

See application file for complete search history.

(56) References Cited

U.S. PATENT DOCUMENTS

| | | | | |
|---|---|---|---|---|
| 4,045,375 A | * | 8/1977 | Komatu | 252/519 |
| 4,316,785 A | * | 2/1982 | Suzuki | 204/192.24 |
| 4,357,426 A | * | 11/1982 | Murata | 501/135 |
| 4,482,644 A | * | 11/1984 | Beyerlein, I | 502/303 |
| 4,503,166 A | * | 3/1985 | Beyerlein, II | 502/303 |
| 4,645,622 A | * | 2/1987 | Kock | 252/521 |
| 5,578,551 A | * | 11/1996 | Chu et al. | 505/125 |
| 6,239,080 B1 | * | 5/2001 | Chu et al. | 505/125 |
| 7,056,866 B1 | * | 6/2006 | Chu | 505/125 |

OTHER PUBLICATIONS

Bednorz, J.G. et al., "Possible High $T_c$ Superconductivity In The Ba-La-Cu-O System," Z. Phys. B, 64, pp. 189-193 (1986).*
Gopalakrishnan, I. et al., "Studies on the $La_{2-x} Sr_x NiO_4$ (0<x>1) System," J. Solid State Chemistry, V. 22, No. 2, pp. 145-149, Oct. 1977.*
Jin, S. et al., "High $T_c$ Superconductors—composite wire Fabrication", Appl. Phys. Lett. 51 (3), Jul. 20, 1987, pp. 203-204.*

(Continued)

*Primary Examiner*—Mark Kopec
(74) *Attorney, Agent, or Firm*—Akin Gump Strauss Hauer & Feld, LLP

(57) ABSTRACT

Described is a superconducting composition comprising an oxide complex of the formula $[L_{1-x}M_x]_a A_b O_y$ wherein L is lanthanum, lutetium, yttrium or scandium; A is copper, bismuth, titanium, tungsten, zirconium, tantalum, niobium, or vanadium; M is barium, strontium, calcium, magnesium or mercury; and "a" is 1 to 2; "b" is 1; "x" is a number in the range of 0.01 to 0.5 and preferably 0.075 to 0.5; and "y" is about 2 to about 4. The oxide complexes of the invention are prepared by solid-state reaction procedure which produce oxide complexes having enhanced superconducting transition temperatures compared to an oxide complex of like empirical composition prepared by a coprecipitation—high temperature decomposition procedure. With a solid-state reaction prepared oxide complex of the invention a transition temperature as high as 100° K has been observed even under atmospheric pressure.

8 Claims, 10 Drawing Sheets

OTHER PUBLICATIONS

Michel, C. et al, The Oxygen Defect Perovskite $BaLa_4 Cu_5 O_{13.4}$, A Metallic Conductor, Mat. Res. Bull., V.20, pp. 667-671, Jun. 1985.*

Nguyen, N. et al., "Oxydes Ternaires . . . etal Semi- Metallique des Oxydes $La_{a-x} Sr_x CuO_{4-x/2+d}$", J. Phys. Chem Solids, vol. 44, No. 5, pp. 389-400, 1983.*

Provost, J. et al., "The OxygenDeFect Perovskites $Ba_3 La_3 Cu O_{614+Y}$ . . . Electron Transport Properties", Synthetic Metals, 4, pp. 157-167, 1981.*

Affidavit of Ruling Meng dated Mar. 6, 2006 (with exhibits).

Affidavit of P. H. Hor dated Mar. 14, 2006 (with exhibits).

Jorgensen, Schüttler, Hinks, Capone II, Zhang, Brodsky; *Lattice Instability and High-$T_c$ Superconductivity in $La_{2-x}Ba_xCuO_4$*, Physical Review Letters, vol. 58, No. 10, pp. 1024-1026 (1987).

Tsuei, Yeh; *High-Transition-Temperature Superconducting Particles in an Insulating Matrix*, AIP Conference Proceedings, Vol/Issue: 58:1, Inhomogeneous Superconductors Conference-1979, pp. 67-78.

Deutscher, *Granular Superconductors for Squids*, AIP Conference Proceedings, vol. 44, Issue 1, Jul. 1978.

Claassen, Cukauskas, Nisenoff; *Granular Weak Link Josephson Devices*, AIP Conference Proceedings, No. 58, Inhomogeneous Superconductors-1979, American Institute of Physics, 1980.

Carr, Garland, Tanner; *Far Infrared Absorption in Granular Superconductors*, AIP Conference Proceedings, No. 58, pp. 288-292, Inhomogeneous Superconductors-1979, American Institute of Physics, 1980.

Maletta, Malozemoff, Cronemeyer, Tsuei, Greene, Bednorz, Müller; *Diamagnetic Shielding and Meissner Effect in the High $T_c$ Superconductor $Sr_{0.2}La_{1.8}CuO_4$*, Solid State Communications, vol. 62, No. 5, pp. 323-326, 1987.

Gordon G. Waggett letter to Lester L. Hewitt re: YBCO Patent Inventorship Issues, 13 pages, Oct. 26, 2006, with Ruling Meng Vita, 20 pages, Power Point Presentation "Evidence Supporting Dr. Ruling Meng's Entitlement to be Named as a Coinventor with Dr. Chu on U.S. Pat No. 7,056,866 . . . ", 39 pages.

Affidavit of Ruling Meng, dated May 25, 2006.

Affidavit of P.H. Hor, Ph.D., dated Mar. 14, 2006.

Brimm, Brantley, Lorenz & Jellinek; *Sodium and Potassium Tungsten Bronzes*, Journal of the American Chemical Society, vol. 73, pp. 5427-5432, Nov. 1951.

Matthias, Suhl & Corenzwit; *Spin Exchange in Superconductors*, Physical Review Letters, 1(3), 92-94 (1958).

Baroch, Charles; *Yttrium*, Mineral Facts And Problems, Anniversary Edition, U.S. Government Printing Office, pp. 1-5, 1960.

Conroy & Yokokawa; *The Preparation and Properties of a Barium Tungsten Bronze*; Inorganic Chemistry, 4(7), pp. 994-996, 1965.

Chu, Smith & Gardner; *Superconductivity of Rhenium and Some Rhenium-Osmium Alloys At High Pressure*, Physical Review Letters, 20(5), 198-201 (1968).

Johnston, Prakash, Zachariasen, Viswanathan; *High Temperature Superconductivity in the Li-Ti-O Ternary System*, Mat. Res. Bull., vol. 8, No. 7, pp. 777-784, 1973.

Longo & Raccah; *The Structure of $La_2CuO_4$ and $LaSrVO_4$*, Journal of Solid State Chemistry, vol. 6, Issue 4, pp. 526-531, Apr. 1973.

Sleight, Gillson & Bierstedt; *High-Temperature Superconductivity in the $BaPb_{1-x}Bi_xO_3$ System*, Solid State Communications, vol. 17, Issue 1, pp. 27-28, Jul. 1975.

Chu & Huang; *Hydrostatic Pressure Effect on $T_c$ of $Ba_{0.9}K_{0.1} Pb_{0.75}Bi_{0.25}O_3$*, Solid State Communications, vol. 18, Issue 8, pp. 977-979, 1976.

Johnston; *Superconducting and Normal State Properties of $Li_{1+x}Ti_{2-x}O_4$ Spinel Compounds. I. Preparation, Crystallography, Superconducting Properties, Electrical Resistivity, Dielectric Behavior, and Magnetic Susceptibility*, Journal of Low Temperature Physics, Vol/Issue: 25:1/2, pp. 145-175, Oct. 1, 1976.

Shaplygin, Kakhan & Lazarev; *Preparation and Properties of the Compounds $Ln_2CuO_4$ (Ln = La, Pr, Nd, Sm, Eu, Gd) and Some of Their Solid Solutions*, Russian Journal of Inorganic Chemistry, 24(6), pp. 820-824, 1979.

Geballe & Chu; *Interface Superconductivity in CuCl?*, "Comments," Solid State Phys, 9(4), 115-126 (1979).

Mousa & Grimes; *A Note on the preparation of the high transition temperature superconductor lithium titanate*, Journal of Materials Science, vol. 15, No. 3, pp. 793-795, Mar. 1980.

Suzuki, Murakami & Inamura; *S superconductivity in $Ba_{1-x}Sr_x Pb_{0.75}Bi_{0.25}O_3$*, Japanese Journal of Applied Physics, 19(2), pp. L72-L74 (1980).

Thanh, Koma & Tanaka; *Superconductivity in the $BaPb_{1-x}Bi_xO_3$ System*, Appl. Phys. A: Materials Science & Processing, vol. 22, No. 2, pp. 205-212 (Jun. 1980).

Er-Rakho, Michel, Provost & Raveau; *A Series of Oxygen-Defect Perovskites Containing $Cu^{II}$ and $Cu^{III}$: The Oxides $La_{3-x}Ln_xBa_{3[} Cu^{II}_{5-2y} Cu^{III}_{1+2y]} O_{14+y}$*, Journal of Solid State Chemistry, vol. 37, Issue 2, pp. 151-156, Apr. 1981.

Michel, Er-Rakho & Raveau; *Les oxides $La_{4-2x}Ba_{2+2x}Cu_{2-x}O_{10-2x}$: Une structure inédite constituée de groupements $CuO_4$ carrés plans isoleés*, Journal of Solid State Chemistry, vol. 39, Issue 2, pp. 161-167, Sep. 1981.

Nguyen, Choisnet, Hervieu & Raveau; *Oxygen Defect $K_2NiF_4$-Type Oxides: The Compounds $La_{2-x}Sr_xCuO_{4-x/2+\delta}$*, Journal of Solid State Chemistry, vol. 39, Issue 1, pp. 120-127, August 1981.

Provost, Studer, Michel & Raveau; *The Oxygen Defect Perovskites $Ba_3La_3Cu_6O_{14+y}$: A Progressive Transition from Semi-Conductive to Semi-Metallic Properties. II. Electron Transport Properties*, Synthetic Metals, vol. 4, Issue 2, pp. 157-167, Dec. 1981.

Wu, Meng, Huang & Chu; *Superconductivity in $BaPb_{1-x}Bi_xO_3$ near the metal-semiconductor phase boundary under pressure*, American Physical Society, Physical Review B, 24(7), 4075-4078 (1981).

Lin, Shao, Wu, Hor, Jin & Chu; *Observation of a reentrant superconducting resistive transition in granular $BaPb_{0.75}Bi_{0.25}O_3$ superconductor*, The American Physical Society, Physical Review B, 29: 1493-1496 (1984).

Sakudo, Uwe, Fujiwara, Fujita & Shiozawa; *Composition Dependence of the Superconductivity in (Ba, Sr) (Pb, Bi) $O_3$*, Japanese Journal of Applied Physics, 23(7), pp. L496-L498 (1984).

Lin, Lin & Chu; *High Pressure Study on $Li_{1+x}Ti_{2-x}O_4$*, Journal of Low Temperatures Physics, vol. 58 (3/4), pp. 363-369 (Feb. 1985).

Michel, Er-Rakho & Raveau; *The Oxygen Defect Perovskite $BaLa_4Cu_5O_{13.4}$, A Metallic Conductor*, Mat. Res. Bull. vol. 20, Issue 6, pp. 667-671, Jun. 1985.

Sakudo, Uwe, Suzuki, Fujita, Shiozawa & Isobe; *Composition Effects on Properties of the Perovskite Superconductor $Ba(Pb, Bi)O_3$*, Journal of the Physical Society of Japan, 55(1), pp. 314-322 (1986).

Bednorz & Müller; *Possible High $T_c$ Superconductivity in the Ba—La—Cu—O System*, Z. Phys. B—Condensed Matter, 64: 189-193 (1986).

Chu; Proposal to the National Science Foundation, Low Temperature Physics Program, Division of Materials Research, Jul. 1986.

Uchida, Takagi, Kitazawa & Tanaka; *High $T_c$ Superconductivity of La-Ba-Co Oxides*, Japanese Journal of Applied Physics, 26(1), L1-L2 (1987).

Chu, Hor, Meng, Gao, Huang & Wang, *Evidence for superconductivity above 40 K in the La-Ba-Cu-O compound system*, Physical Review Letters, 58(4), 405-407 (1987).

Cava, Van Dover, Batlogg & Rietman; *Bulk Superconductivity at 36 K in $La_{1.8}Sr_{0.2}CuO_4$*, Physical Review Letters, 58(4), 408-410 (1987).

Chu, Hor, Meng, Gao & Huang, *Superconductivity at 52.5 K in the Lanthanum-Barium-Copper-Oxide System*, Science 30, vol. 235(4788), 567-568 (Jan. 1987).

Bender, Toth, Spann, Lawrence, Wallace, Lewis, Osofsky, Fuller, Skelton, Wolf, Qadri & Gubser; *Processing and Properties of the High $T_c$, Superconducting Oxide Ceramic $YBa_2Cu_3O_7$*, Advanced Ceramic Materials, 2(3B), 506-511, Jul. 1987.

Osofsky, Fuller, Toth, Qadri, Lawrence, Hein, Gubser, Wolf, Pande, Singh, Skelton & Bender; *Preparation, Structure, and Magnetic Field Studies of High $T_c$ Superconductors*, Compilation of NRL Publications on High Temperature Superconductivity, pp. 105-113, Jul. 1987.

Gubser, Wolf, Osofsky, Bender, Lawrence, Skelton & Qadri; *High Temperature Superconductors*, Proceedings of Symposiums, 1987 MTG of the Materials Research Society, Apr. 23-24, 1987, Abstract.

Osofsky, Toth, Lawrence, Qadri, Shih, Mueller, Hein, Fuller, Rachford, Skelton, Elam, Gubser, Wolf, Gotaas, Rhyne, Kurtz &

Stockbauer; Experimental Program on High $T_c$ Oxide Superconductors at the Naval Research Laboratory, MRS Conf. Proc. Apr. 23, 1987, pp. 97-99.

Rhyne, Neumann, Gotaas, Beech, Toth, Lawrence, Wolf, Osofsky & Gubser; *Phonon Density of States and Structure of the Superconductor $YBa_2Cu_3O_7$* Compilation of NRL Publications, pp. 83-96, 1987.

Skelton, Elam, Gubser, Hein, Letourneau, Osofsky, Qadri, Toth & Wolf, *A Coupled Structural and Electrical Transition in $La_2CuO_4$ Near 30 K,* Compilation of NRL Publications, pp. 191-193, 1987.

Skelton, Qadri, Bender, Edelstein, Elam, Francavilla, Gubser, Holtz, Lawrence, Osofsky, Toth & Wolf; *Structural Considerations of Cu-Oxide Based High-$T_c$ Superconductors,* Compilation of NRL Publications, pp. 33-36, 1987.

Toth, Skelton, Wolf, Qadri, Osofsky, Bender, Lawrence & Gubser; *Relationship Between Processing Procedure, Crystal Structure and Superconducting $T_c$ in the Y-Ba-Cu-O System,* Compilation of NRL Publications, pp. 37-48, 1987.

Tarascon, Greene, Mckinnon, Hull & Geballe; *Superconductivity at 40 K in the Oxygen-Defect Perovskites $La_{2-x}Sr_xCuO_{4-y}$,* Science, vol. 235, No. 4794, pp. 1373-1376, Mar. 1987.

Gubser, Hein, Lawrence, Osofsky, Schrodt, Toth, Wolf, *Superconducting phase transitions in the La-M-Cu-O layered perovskite system, M=La, Ba, Sr, and Pb,* Physical Review B, vol. 35, 5350-5352 Apr. 1987.

Wu, Ashburn, Torng (all UAL), Hor, Meng, Gao, Huang, Wang, & Chu (all UH), *Superconductivity at 93K in a New Mixed-Phase Y-Ba-Cu-O Compound System at Ambient Pressure,* Physical Review Letters, 58:9, 908-910 Mar. 1987.

Hor, Gao, Meng, Huang, Wang, Forster, Vassilious, Chu (all UH), Wu, Ashburn, & Torng (all UAL), *High-Pressure Study of the New Y-Ba-Cu-O Superconductivity Compound System,* Physical Review Letters, 58:9, 911-912 Mar. 1987.

Moss, Forster, Axe, You, Hohlwein, Cox, Hor, Meng, Chu, *High-resolution synchroton x-ray study of the structure of $La_{1.8}Ba_{0.2}CuO_{4-y}$,* Phys. Rev. B: Condensed Matter and Materials Physics, 35(13), 7195-7198 May 1987.

Ganguly, Ram, Sreedhar & Rao; *Identification of the high-temperature superconducting phase in the Y-Ba-Cu-O system as the perovskite $YBa_2CU_3O_{7\pm\delta}$,* Pramana-J. Phys., 28(3), L321-L323, Mar. 1987.

Moodenbaugh, Suenaga, Asano, Shelton, Ku, McCallum & Klavins; *Superconductivity Near 90 K in the Lu-Ba-Cu-O System,* Phys. Rev. Lett., 58 (1987) 1885-1887, May.

Qadri, Toth, Osofsky, Lawrence, Gubser & Wolf; *X-Ray Identification of the Superconducting High-$T_c$ Phase in the Y-Ba-Cu-O System,* Phys. Rev. B., vol. 35, Issue 13, 7235-7237 May 1987.

Boyce, Bridges, Claeson, Geballe, Chu, Tarascon, *X-ray-absorption studies of the high-$T_c$ superconductors $La_{1.8}Sr_{02}CuO_4$ and $La_{1.8}Ba_{0.2}CuO_4$,* Phys. Rev. B: Condensed Matter and Materials Physics, 35(13), 7203-7206 May 1987.

Jayaraman, Hutson, McFee, Coriell, Maines; *Hydrostatic and Unianxial Pressure Generation using Teflon Cell Container in Conventional Piston-Cylinder Device,* The Review of Scientific Instruments, vol. 38, No. 1, Jan. 1967.

Grover, Dhar, Paulose, Nagarajan, Sampahkumaran; *Influence of Chemical Pressure on the Superconductivity of $La_{1.8}Sr_{0.2}CuO_4$,* Japanese Journal of Applied Physics, vol. 26 (1987) Supplement 26-3.

Olsen, Andres, Geballe; *The Pressure Dependence of the Superconducting Transition Temperature,* Physics Letters, Feb. 12, 1968; vol. 26A, No. 6, pp. 239-240.

Missell, Schwartz; *Superconducting Materials,* Encyclopedia of Chemical Technology, 3d Ed. vol. 22, pp. 298-331,1983.

Nguyen, Studer, Raveau; *Oxydes Ternaires de Cuivre a Valence Mixte de Type $K_2Nif_4$ Deficitaires en Oxygene : Evolution Progressive D'un Etat Semi-Conducteur Vers Un Etat Semi-Metallique Des Oxydes $La_{2-x}Sr_xCuO_{4-x/2+\delta}$,* Journal of Phys. Chem. Solids, vol. 44, No. 5, pp. 389-400, 1983.

Mattens, Aarts, Moleman, Rachman, De Boer; *Chemical Pressure Effects in Sc-Substituted YbCuAl,* Valence Instabilities, pp. 211-214, 1982.

Raaen, Parks; *Mixed Valence in $CeNi_5$, Effects of Dilution and Chemical Pressure,* Solid State Communications, vol. 48, No. 2, pp. 199-202, Oct. 1983.

Millon, Gerardin, Bonazebi, Brice, Evrard; *Effet D'une Pression Chimique Locale Sur La Structure Cristalline De $CaFe_2O_4$=Effect of local chemical pressure upon the crystal structure of $CaFe_2O_4$,* Revue De Chimie Minérale, vol. 23, No. 6, pp. 782-788, 1986.

Testardi, Wernick, Royer; *Superconductivity With Onset Above 23° K in Nb—Ge Sputtered Films,* Solid State Communications, vol. 15, Issue 1, pp. 1-4, 1974.

Gavaler; *Superconductivity in Nb-Ge films above 22k*,* Appl. Phys. Lett. 23, 480 (1973).

Ronay; *Hole Formation in Orthorhombic and Tetragonal $YBa_2Cu_3O_{7-x}$,* Phys. Rev. B, vol. 36, Issue 16, pp. 8860-8862 Dec. 1987.

Smyth; *Defects and Order in Perovskite-Related Oxides,* Annual Review of Materials Science, vol. 15: 329-357, Aug. 1985.

Torardi, McCarron, Subramanian, Horowitz, Michel, Sleight, Cox; *Structure-Property Relationships for $RBa_2Cu_3O_x$ Phases,* American Chemical Society: Symposium Series (1987) 351, 152-163.

Jorgensen; *Structural properties of High-$T_c$ Oxide Superconductors*; Japanese Journal of Applied Physics 26 (1987) Supplement 26-3-3, pp. 2017-2022.

Sampathkumaran, Dhar, Malik; *Investigation of chemical pressure effects on the magnetic behaviour of $CeRh_2Si_2$,* J. Phys. C: Solid State Phys. 20 (1987) L53-L56.

Kresin; *Parameters and Exotic Properties of High Tc Superconductors,* Naval Research Laboratory, Washington DC, Jan. 1987.

Yu, Freeman, Xu; *Electronically Driven Instabilities and Superconductivity in the Layered $La2-xBaxCuO4$ Perovskites,* Physical Review Letters, vol. 58, No. 10, Mar. 9, 1987.

Li, Zhao, Lu, Wang; *Superconductivity of Sr-La-Cu-O Thin Films,* Chinese Phys. Lett., vol. 4, No. 5 (1987).

Morris, Scheven, Bourne, Cohen, Crommie, Zettl; *Mobile Oxygen and Isotope Effect in the High Temperature Superconductor $YBa_2Cu_3O_{7-\delta}$, Proceed of Symp,* 1987 Spring Meeting of Material Research Society, pp. 209-213.

Chester, Jones; *Superconductivity at Very High Pressures,* Phil. Mag., pp. 1281-1290 (1953).

Guertin, Praddaude, Foner, McNiff; *Magnetic Moment, Susceptibility, and Electrical Resistivity of Dilute Paramagnetic Palladium—Rare-Earth Alloys,* Physical Review B, vol. 7, No. 1, Jan. 1, 1973.

Kwestroo, Van Hal, Langereis; *Compounds in the System $BaO-Y_2O_3$,* Mat. Res. Bull. vol. 9 No. 12, pp. 1631-1637 (1974).

Michel, Raveau; *Les oxides $A_2BaCuO_5$ (A = Y, Sm, Eu, Gd, Dy, Ho, Er, Yb),* Journal of Solid State Chemistry, vol. 43, Issue 1, pp. 73-80, Jun. 1982.

Pascard, *Equivalence of ion-size effect and hydrostatic-pressure effect on exchange coupling in spinels and garnets,* Physical Review B, vol. 31, Issue 5, Mar. 1, 1985.

Bednorz, Takashige, Müller; *Susceptibility Measurements Support High-$T_c$ Superconductivity in the Ba-La-Cu-O System,* Europhysics Letters, 3(3), pp. 379-386 (1987).

Ravy, Moret, Pouget, Comes; *Competition between organic superconductivity and a displacive structural modulation in the molecular stacks in bis (ethylenedithio) tetrathiafulvalene perrhenate, $(BEDT-TTF)_2ReO_4$,* Physical Review B, vol. 33, No. 3, (1986).

Schwenk, Parkin, Lee, Greene; *Superconductivity in sulfur-based organic superconductors: A volume property,* Physical Review B, vol. 34, No. 5, (1986).

Michel, Raveau; *Les oxydes $A_2BaCuO_5$ (A = Y, Sm, Eu, Gd, Dy, Ho, Er, Yb),* Journal of Solid State Chemistry 43, 73-80 (1982).

Papaconstantopoulos, Pickett, Krakauer, Boyer; *Calculations of the Superconducting Properties of Cu-O Based Perovskite-Like Structures,* Japanese Journal of Applied Physics 26 (1987) Supplement 26-3-2, pp. 1091-1092.

Takagi, Uchida, Kitazawa, Tanaka; *High-$T_c$ Superconductivity of La-Ba-Cu Oxides. II.—Specification of the Superconducting Phase,* Jpn. J. Appl. Phys. 26 (1987) pp. L123-L124.

Van Dover, Cava, Batlogg, Rietman; *Composition-dependent superconductivity in $La_{2-x}Sr_xCuO_{4-y}$,* Physical Review B, vol. 35, No. 10, pp. 5337-5339, Apr. 1987.

* cited by examiner

HIGH TRANSITION TEMPERATURE SUPERCONDUCTING COMPOSITIONS

CROSS-REFERENCE TO RELATED APPLICATIONS

This is a file-wrapper continuation of Ser. No. 07/102,205 filed Feb. 6, 1987 now abandoned, which is a continuation-in-part of Ser. No. 07/006,991, filed Jan. 26, 1987, entitled "Superconducting Compositions and Method for Enhancing Their Transition Temperatures By Pressure," now abandoned, which in turn is a continuation-in-part of Ser. No. 07/002,089, filed Jan. 12, 1987, entitled "Superconducting Composition and Method," now abandoned.

STATEMENTS REGARDING FEDERALLY SPONSORED RESEARCH OR DEVELOPMENT

This invention was made with Government support under Grant No. DMR-8204173 awarded by the National Science Foundation and Grant No. NAGW-977 awarded by the National Aeronautics and Space Administration, and the Government has certain rights in the invention.

BACKGROUND OF THE INVENTION

This invention relates to superconducting compositions, i.e., compositions offering no electrical resistance at a temperature below a critical temperature; to processes for their production and to methods for their use; and to methods for increasing the superconducting transition temperature of superconducting compositions.

Superconductivity was discovered in 1911. Historically, the first observed and most distinctive property of a superconductive material is the near total loss of electrical resistance by the material when at or below a critical temperature that is a characteristic of the material. This critical temperature is referred to as the superconducting transition temperature of the material, $T_C$. The criteria by which a selection of the critical temperature value is determined from a transition in the change in resistance observed is often not obvious from the literature. Many past authors have chosen the mid-point of such curve as the probable critical temperature of their idealized material, while many others have chosen to report as the critical temperature the highest temperature at which a deviation from the normal state resistivity property is observed. Hence, the literature may report differing temperatures within a narrow range as the critical or superconducting transition temperature for the same material, depending on the particular author's method for selecting $T_C$ from the observed data.

The history of research into the superconductivity of specific materials began with the discovery in 1911 that mercury superconducts at a transition temperature of about 4° K. In the late 1920's, NbC was found to superconduct at a higher temperature, namely up to about 10.5° K. Thereafter other compounds and alloys of Nb were examined and various Nb compositions were discovered with progressively, but only slightly higher, superconducting transition temperatures. In the early 1940's NbN was observed with a transition temperature of about 14° K; $Nb_3Sn$ was reported in the early 1950's; $Nb_3$ (Al—Ge) was reported in the late 1960's; and $Nb_3Ge$ was reported in the early 1970's to have a transition temperature of about 17° K. Careful optimization of $Nb_3Ge$ thin films led to an increase of the critical temperature for such material up to 23.3° K. While this work led to progress the maximum temperature at which superconductivity could occur was raised to only 23.3° K since research started three-quarters of a century ago. The existing theories explained the superconductivity of these materials, but did not predict superconductivity of higher than 40° K. Significant progress in finding materials which superconduct at higher transition temperatures than that of $Nb_3Ge$ thin films was not made until 1986.

In 1986, specially prepared coprecipitated and heat treated mixtures of lanthanum, barium, copper and oxygen, that have an abrupt decrease in resistivity at an onset temperature as high as 30° K which exhibited a phenomena "reminiscent of the onset of percolative superconductivity" were reported by J. G. Bednorz and R. A. Muller, "Possible High $T_C$ Superconductivity in The Ba—La—Cu—O System," Z. Phys. B.—Condensed Matter, 64, pp. 189-193 (1986). Under atmospheric pressure conditions, the abrupt change in resistivity for these compositions—i.e., that temperature at which a portion of the material begins to show properties reminiscent of percolative superconductivity—were reported to approach the 30° K range. The authors refer to this phenomenon as a "possible" case of superconductivity. The compositions reported by Bednorz et al to have such properties at a temperature as high as 30° K comprise $La_{5-x}Ba_xCu_rO_{3-y}$, where x=0.75 to 1 and Y>0. The Bednorz et al compositions are prepared by coprecipitation of Ba—, La— and Cu— nitrate solutions by addition to an oxalic acid solution followed by decomposition and solid-state reaction of the coprecipitate at 900° C. for 5 hours. Thereafter, the composition is pressed to pellets at 4 kilobars and the pellets are sintered at a temperature below 950° C. in a reduced oxygen atmosphere of $0.2 \times 10^{-4}$ bar. Bednorz et al reported that this method of sample preparation is of crucial importance to obtaining the observed phenomena.

Superconductivity is a potentially very useful phenomenon. It reduces heat losses to zero in electrical power transmission, magnets, levitated monorail trains and many other modern devices. However, superconductivity of a material occurs only at very low temperatures. Originally, and until the inventions outlined herein, liquid helium was the required coolant to provide the conditions necessary for superconductivity to occur.

It would be desirable to produce a superconducting composition that has a transition temperature which exceeds those of superconducting compositions previously described. It would be particularly desirable to develop a superconducting composition that has the potential of having a $T_C$ of 77° K or higher. Such a composition would enable the use of liquid nitrogen instead of liquid helium to cool the superconducting equipment and would dramatically decrease the cost of operating and insulating superconducting equipment and material.

SUMMARY OF THE INVENTION

Described is a superconducting composition comprising an oxide complex of the formula $[L_{1-x}M_x]_aA_bO_y$ wherein, L is lanthanum, lutetium, yttrium or scandium; A is copper, bismuth, titanium, tungsten, zirconium, tantalum, niobium, or vanadium; M is barium, strontium, calcium magnesium or mercury; and "a" is 1 to 2; "b" is 1; "x" is about 0.01 to about 0.5 and preferably 0.075 to 0.5; and "y" is about 2 to about 4. The oxide complexes of the invention are prepared by a solid-state reaction procedure which produce oxide complexes having enhanced superconducting transition temperatures compared to an oxide complex of like empirical composition prepared by a coprecipitation—high temperature decomposition procedure.

When M is barium, the transition temperatures of onset and complete superconductivity, $T_{C0}$ and $T_{C1}$ (as seen in FIG. 5), respectively, may be increased by subjecting the barium species of the oxide complex to pressure up to 18 kilobars. Likewise the non-barium species of the oxide complexes of the invention exhibit an enhancement to higher limits of their superconducting transition temperatures when subjected to high pressures.

The application and maintenance of high pressure on such oxide complexes is believed to enhance the transition temperature to higher limits by reducing the interatomic spacings between elements L, A, M and O compared to their respective spacings when the oxide complex is under atmospheric pressure only.

Alternatively, an alkaline earth metal having atomic radius smaller than barium may be used in whole or in part to fulfill the alkaline earth metal constituent requirement to provide an oxide complex having reduced interatomic spacings between elements, L, A, M, and O even when the oxide complex is under only atomospheric pressure, compared to a pure barium species, thus increasing $T_{C0}$ and $T_{C1}$ of such substituted or non-barium oxide complex species.

With a solid-state reaction prepared oxide complex of the invention a transition temperature as high as 100° K has been observed even under atmospheric pressure.

DETAILED DESCRIPTION OF THE PREFERRED EMBODIMENTS

Figure 1:
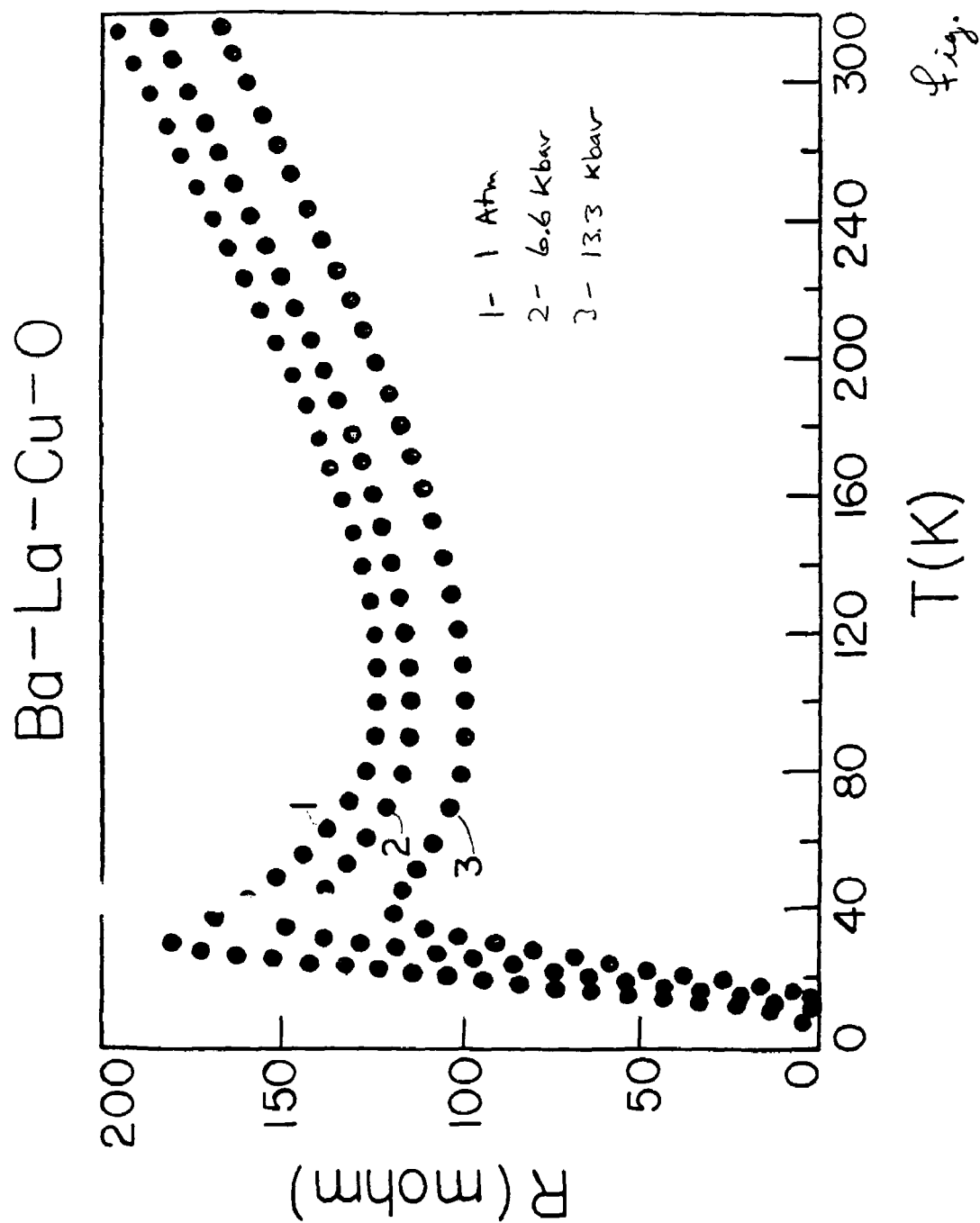
FIG. 1 illustrates the reduction in electrical resistance as temperature is decreased of a La—Ba—Cu—O composition as prepared according to Example V.

Superconducting compositions of this invention comprise an oxide complex defined by the following formula:

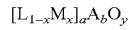

wherein "L" is an element selected from the group consisting of lanthanum, lutetium, yttrium and scandium, or a mixture of one or more of these elements; wherein "A" is an element selected from the group consisting of copper, bismuth, titanium, tungsten, zirconium, tantalum, niobium, vanadium or a mixture of one or more of these elements; wherein "M" is an element selected from the group consisting of barium, strontium, calcium, magnesium and mercury or a mixture of one or more of these elements; and wherein "x" is from about 0.01 to about 0.5, and preferably 0.075 to 0.5; "a" is 1 to 2, "b" is 1, and "y" is about 2 to about 4. The amount of oxygen present in the compositions of the present invention depends upon the valence requirements of the other elements and the defects resulting from the particular heat treatment used to make the composition. The molar oxygen content "y" is about 2 to 4 times "b," as used in the preceding equation. Lanthanum is the preferred "L" component, barium and strontium are the preferred "M" components, and copper is the preferred "A" component.

It has been observed that the transition temperature of such an oxide complex is increased by the application of pressure to the composition. It is believed that subjecting the oxide complex to high pressures decreases the interatomic distances or lattice spacing in such complexes and that this may, at least in part, account for the enhancement of transition temperatures that has been observed. Another way to obtain a decrease of the intertomic distances or lattice spacings is during the preparation of the oxide complex. Thus, for example, an alkaline earth metal having an atomic radius smaller than barium may be used in whole or in part to fulfill the alkaline earth metal requirement to produce an oxide complex having reduced interatomic distances or lattice spacing compared to an oxide complex with barium alone, with a consequent increase in the transition temperature of the non-barium oxide complex resulting compared to one produced with barium alone. The transition temperature is increased in such an oxide complex even as measured under atmospheric pressure.

The present invention also provides a solid-state reaction method for making such superconducting oxide complexes which comprises; thoroughly mixing selected amounts of solid powdered compounds containing L, M, A, and O, preferably by selecting appropriate amounts of $L_2O_3$ or $L(OH)_3$, $MCO_3$ and AO; heating the powdered mixture in an oxygen containing atmosphere, at an appropriate pressure, and at a temperature of between about 640° C. and 800° C. for a time sufficient to react the mixture in the solid state; heating the resulting mixture at a temperature between about 900° C. and 1100° C., preferably for at least twelve hours; homogenizing said reaction mixture; heating the homogenized reaction mixture at a temperature between about 900° C. and about 1100° C., preferably for at least six hours; compressing said composition with a pressure of at least one kilobar to produce pellets; sintering said pellets; and quenching said sintered pellets rapidly from the sintering temperature to room temperature in air or in an inert gas atmosphere such as Ar. Preferably mixing of the solid powder compounds is performed by an intensive mixer such as a ball mill.

An alternative method for making such oxide complex superconductive compositions includes the following steps: thoroughly mixing selected amounts of solid powdered compounds containing L, M, A, and O, preferably by selecting appropriate amounts of $L_2O_3$ or $L(OH)_3$, $MCO_3$ and AO; compressing said mixture into pellets; reacting said mixture at a temperature between about 900° C. and about 1100° C. for a time sufficient to complete the solid state reaction; and rapidly quenching said pellets to room temperature. Again, mixing is preferably accomplished by an intensive mixer such as a ball mill. Pelletization of the oxide mixture is carried out at an applied pressure of from about 100 to about 30,000 psi and preferably at an applied pressure of from about 100 to about 500 psi, most preferably at about 500 psi. Reaction of the pelletized mixture is preferably conducted in air for about 5 minutes to about 24 hours, and most preferably for about 5 to about 15 minutes. Following the completion of the reaction step the reacted pellet composition is preferably quenched to room temperature in air, most preferably on an aluminum plate as a heat sink.

Another method for preparing oxide complexes which exhibit significantly enhanced transition temperatures includes the following steps: thoroughly mixing selected amounts of solid powdered compounds containing L, M, A and O, preferably by selecting appropriate amounts of $L_2O_3$ or $L(OH)_3$, $MCO_3$ and AO; depositing the oxide mixture on a copper substrate which has been cleaned of its copper oxide surface film, preferably by acid cleaning in dilute hydrochloric acid solution; compressing the oxide mixture against the copper substrate at an applied pressure of from about 100 to about 1000 psi, preferably at about 100 to 200 psi, to form the oxide mixture into a film or layer on the copper substrate; heating the copper substrate and oxide mixture layered thereon to a temperature of from about 900 to about 1100° C. in air for from about 5 minutes to about 24 hours, and preferably for about 5 to about 15 minutes; and quenching the copper substrate and oxide mixture layered thereon to room temperature in air. Inspection of the oxide mixture layer which results from this method of preparation discloses that it comprises three phases, the first of which adjacent the copper substrate comprises a glassy insulating layer phase; the second phase is the superconducting layer phase; and the third phase which borders with the second superconducting phase is a powdery compound which is also an insulator layer phase.

Still another alternative method includes the immediately foregoing steps and the step of reducing interatomic distances, either by the application of pressure to the oxide complex or by the use of atomic elements which provides smaller lattice spacings. A preferred oxide complex which exhibits a significantly enhanced superconducting transition temperature is prepared by utilizing yttrium as the "L" component.

Oxide complexes of the formula $[L_{1-x}M_x]_a A_b O_y$ prepared by a solid-state reaction procedure as described exhibit superconducting properties at transition temperatures higher than heretofore reported. The barium species of the oxide complex, that is wherein "M" is only barium, as prepared by the described solid-state reaction procedure exhibits superconducting properties beginning at a higher onset temperature ($T_{co}$) than the temperature reported by Bednorz et al as that wherein, for an oxide complex of similar empirical composition but prepared by a coprecipitation method, a phenomenon "reminiscent of the onset of percolative superconductivity" was observed. Further, it has been surprisingly found that the superconductivity transition temperature of oxide complexes of the formula $[L_{1-x}M_x]_a A_b O_y$ prepared by the solid-state reaction procedure is further enhanced towards higher limits by the application to and maintenance of pressure on the oxide complex up to about 18 kilobars.

Based upon present belief, it is thought that the application of and maintenance of high pressure on such oxide complexes enhances their superconducting transition temperature by producing a reduction of the interatomic distance or lattice spacing between the metal atoms forming the complex. The application and maintenance of high pressure on such oxide complexes may also enhance the transition temperature by suppressing instabilities detrimental to a high temperature superconductivity and thus permitting the existence of superconducting phase species to occur within the body of the oxide complex at a higher temperature than that at which such phase could form at atmospheric pressure. Pressure has been found to enhance the $T_C$ of La—Ba—Cu—O and La—Sr—Cu—O oxide complexes at a rate of greater than $10^{-3\circ}$ K-bar$^{-1}$ and to raise the onset $T_C$ to 57° K, reaching a zero-resistance state at 40° K. It is believed that pressure reduces the lattice parameter and enhances the $Cu^{+3}/Cu^{+2}$ ratio in the compounds. The unusually large pressure effect on $T_c$ suggest that the high temperature superconductivity in La—Ba—Cu—O and La—Sr—Cu—O complexes may be associated with interfacial effects arising from mixed phases; interfaces between the metal and insulator layers, or concentration fluctuations within the $K_2NiF_4$ phase; strong superconducting interactions due to the mixed valence states; or a yet unidentified phase. Although the unexpected enhancement of transition temperature that the application of pressure to such oxide complexes produces has been repeatedly observed, a mechanism which adequately explains the pressure effect has not yet been fully determined.

The transition temperature of such oxide complexes is enhanced by the application of pressure, and that this effect is at least in part due to a resulting reduction in interatomic spacing in the oxide complex is evidenced by an enhancement of transition temperature that may be produced without the application of extrinsic pressure by employing in the formation of the oxide complex an alkaline earth metal having smaller atomic radius than that of barium. A similar enhancement of transition temperature has been observed when yttrium is used as the "L" component rather than lanthanum.

Hence, when preparing an oxide complex of the invention, it is preferred to completely or partially substitute for the barium atoms, atomic radius of 2.22 angstroms, smaller alkaline earth metal atoms, i.e., strontium, atomic radius of 2.15 angstroms, calcium, atomic radius of 1.97 angstroms, or magnesium, atomic radius of 1.6 angstroms. Similarly, complete or partial substitution of the lanthanum atoms, atomic radius of 1.87 angstroms, with the smaller lutetium atoms, atomic radius of 1.75 angstroms, or yttrium, atomic radius 1.78 angstroms, will provide this same effect. The application of pressure to such oxide complexes that are prepared to have decreased interatomic spacings will further enhance the transition temperature of such compositions to higher limits.

Alternatively, the deposition of a lanthanum, barium, copper, oxide film on a substrate with smaller lattice parameters, such as a lanthanum, calcium, copper oxide substrate, will reduce the interatomic spacing of the superconducting composition, and thus will increase the $T_c$ of the oxide complex composition. Further, cladding of a lanthanum, barium, copper oxide composition with metals having larger thermal expansion coefficients, such as copper, will apply and maintain the pressure required to reduce the interatomic distances between the elements in the oxide complex composition and hence will increase the $T_c$ of the composition.

The oxide complexes of the present invention may be made, for example, following either of the following processes.

1. Appropriate amounts of $L_2O_3$ or $L(OH)_3$, $MCO_3$ and AO are thoroughly mixed. This mixing is preferably done mechanically, as in a jar mill or more preferably in an intensive mixer such as a ball mill, for at least 12 hours. The mixing produces finely ground particles. The mixture is then heated in an oxygen containing atmosphere, at an appropriate pressure, and at a temperature between about 640-800° C. The temperature of the mixture is conveniently increased to the 640-800° C. target temperature at a rate of 10° C. per minute. The mixture is kept at this target temperature for a time sufficient to allow the solid-state mixture to react. Preferably, the mixture is allowed to react for about an hour. After this reaction step, the temperature is raised to about 900 to about 1100° C., conveniently at a rate of about 30° C. per minute. The samples are kept at the 900 to 1100° C. temperature for a time sufficient to complete the solid state reaction of the materials, the completed solid state reacted product being that product having the components completely diffused through the composition. The samples are then cooled to room temperature.

The next step is to homogenize the sample, preferably by pulverizing the reacted mixture in a jar mill and more preferably in a ball mill for at least 1 hour. The pulverized mixture is then heated rapidly to between 900-1100° C. The mixture is maintained at this temperature preferably for at least 6 hours. After this step, the mixture is compressed under a pressure of at least one kilobar. This compresses the powdered mixture into pellets or some other coherent compacted form as desired. The pellets are then sintered into solid cylinders. This sintering process is preferably performed at a pressure between zero to two kilobars at a temperature of between about 900-1100° C. and for about four hours. Finally, the samples are quenched rapidly from this temperature of between 900-1100° C. to room temperature, in air, or an inert gas atmosphere. This final step, along with thorough mixing of this mixture, decreases the range of the superconducting transition of the composition. This superconducting transition range is the range of temperatures between the point when a portion of the material shows superconductive properties (onset transition temperature) and the temperature at which the composition shows complete superconductive properties.

Compositions made in this process may be compressed to pressures that exceed atmospheric pressure, preferably in the range of 1 to 20 kilobars. This increase in pressure typically increases the $T_c$ of the composition.

2. A second process for producing superconducting compositions of the present invention comprises: thoroughly mixing, preferably for at least about 12 hours, appropriate amounts of $L_2O_3$ or $L(OH)_3$, $MCO_3$, and $AO$, by mechanical means, such as in a jar mill or more preferably in a ball mill, compressing the mixture into pellets; and reacting the pellets at about 900-1100° C. This reaction preferably takes place in an air atmosphere; after which the reacted pellets are rapidly quenched to room temperature.

This second method sometimes results in multiphase samples in a less controllable way.

The superconducting compositions of the present invention have the potential for being used in a wide variety of applications. For example, when used in a wire or conductor form, they may be used in electrical power transmission, energy storage, controlled fusion reaction, electricity generation, mass transportation and magnets. In a thin film form, they may be used in ultra-sensitive detectors and in ultra-fast computers. In addition, they may be used in a superconducting-magnetic-superconducting multi-layer form for use in ultra-sensitive ultra-fast electromagnetic micro devices.

The following examples are representative of the oxide complexes and methods of producing the oxide complexes of the invention. The examples for certain of the compositions also illustrate the enhancement of transition temperature that is produced by the application and maintenance of high pressure on the oxide complexes. Generally, the standard 4-probe technique was used to measure resistivity, and an inductance bridge was employed for ac magnetic susceptibility x-determination. The temperature was measured using the Au+0.07% Fe-chromel, and chromel-alumel thermocouples in the absence of a magnetic field, and a carbon-glass thermometer in the presence of a field. The latter was calibrated against the former without a field. Magnetic fields up to 6T were generated by a superconducting magnet.

EXAMPLE I 6.0 grams of $La_2O_3$, 0.61 grams of $SrCO_3$ and 1.63 grams of CuO were mixed in a jar mill for about 12 hours. The mixture was then heated at a rate of about 10° C. per minute in air at 1 atmosphere pressure, until it reached a temperature of about 720° C. The mixture was then allowed to react for about an hour at about 720° C. After this reaction step, the temperature was raised to a temperature of about 1000° C. at a rate of about 30° C. per minute. Once at a 1000° C. temperature, the samples were maintained at this temperature for about twenty-one hours. This allowed the completion of a solid state reaction. After cooling to room temperature, the reacted mixture was pulverized in a jar mill for about 6 hours until the sample was homogenized. The pulverized mixture was then heated rapidly to a temperature of about 1000° C., and kept at that temperature for about seven hours. After this period, the mixture was cooled to room temperature and then compressed under a pressure of six kilobars. This compression converted the mixed powder into pellets. The pellets were then sintered into solid cylinders by heating them at a temperature of about 1000° C. for a period of about four hours at a pressure of almost zero kilobars. Finally, the sample was rapidly quenched from this temperature to room temperature in air.

The resulting lanthanum-strontium-copper-oxide composition had an empirical formula of $La_{1.8}Sr_{0.2}Cu_1O_y$. This corresponds to an oxide complex of the general formula $[La_{1-x}Sr_x]_aCu_bO_y$ wherein "x" is 0.1, "a" is 2, "b" is 1 and "y" is 2 to 4. The oxide complex composition had an onset superconductivity transition temperature ($T_{co}$) of 45° K, with a narrow transition width to complete superconductivity of about 10° K at ambient pressure.

EXAMPLE II 6.0 grams of $La_2O_3$, 0.61 grams of $SrCO_3$ and 1.63 grams of CuO were mixed mechanically in a jar mill for approximately 24 hours. The resulting mixture was then compressed into pellets by applying a pressure of about 2 kilobars. The pellets were heated to about 1000° C., and allowed to react for about twenty-four hours in air. The reacted pellets were then quenched rapidly to room temperature.

The La—Sr—Cu—O composition produced from this process had a formula of $La_{1.8}Sr_{0.2}Cu_1O_y$. This corresponds to an oxide complex of the general formula $[La_{1-x}Sr_x]_aCu_bO_y$ wherein "x" is 0.1, "a" is 2, "b" is 1 and "y" is 2 to 4. This composition showed superconductive properties at a temperature of about 42° K, with a narrow transition width of about 6° K at ambient pressure.

EXAMPLE III 6.0 grams of $La_2O_3$, 0.81 grams of $BaCO_3$ and 1.63 grams of CuO were mixed in a mortar-pestle apparatus for about 3 hours. The mixture was then heated at a rate of about 10° C. per minute in oxygen at a pressure of about 2000 microns Hg, until it reached a temperature of 720° C. The mixture was then allowed to react for about an hour at about 720° C. After this reaction, the temperature was raised to a temperature of about 950° C., this raise in temperature was made at a rate of about 30° C. per minute. Once at this temperature, the sample was maintained at this temperature for about twenty-one hours. After this period, the sample was cooled to room temperature and then the reacted mixture was pulverized until the sample was homogenized. The pulverized mixture was then heated rapidly to a temperature of about 950° C., and kept at that temperature for about seven hours. After this period, the sample was again cooled to room temperature and the mixture was compressed under a pressure of six kilobars. This compression converted the mixed powder into pellets. The pellets were then sintered into solid cylinders by heating them at a temperature of about 950° C. for a period of about four hours at ambient atmospheric pressure. Finally, the sample was rapidly quenched from this temperature to room temperature in air.

The resulting lanthanum-barium-copper-oxide composition had the formula $La_{1.8}Ba_{0.2}Cu_1O_y$. The oxide complex so formed was of the formula $[La_{1-x}Ba_x]_aCu_bO_y$, wherein "x" is 0.1, "a" is 2, "b" is 1 and "y" is 2 to 4. This composition was found to be superconducting at 39° K at ambient pressure. This composition was then placed inside a pressure cell and the composition was compressed to a pressure of 14 kilobars at room temperature. After this compression step, the temperature was gradually reduced until the composition showed superconducting properties. This composition showed superconductivity properties at a temperature of 52.5° K at the applied pressure of 10 kilobars.

Figure 5:
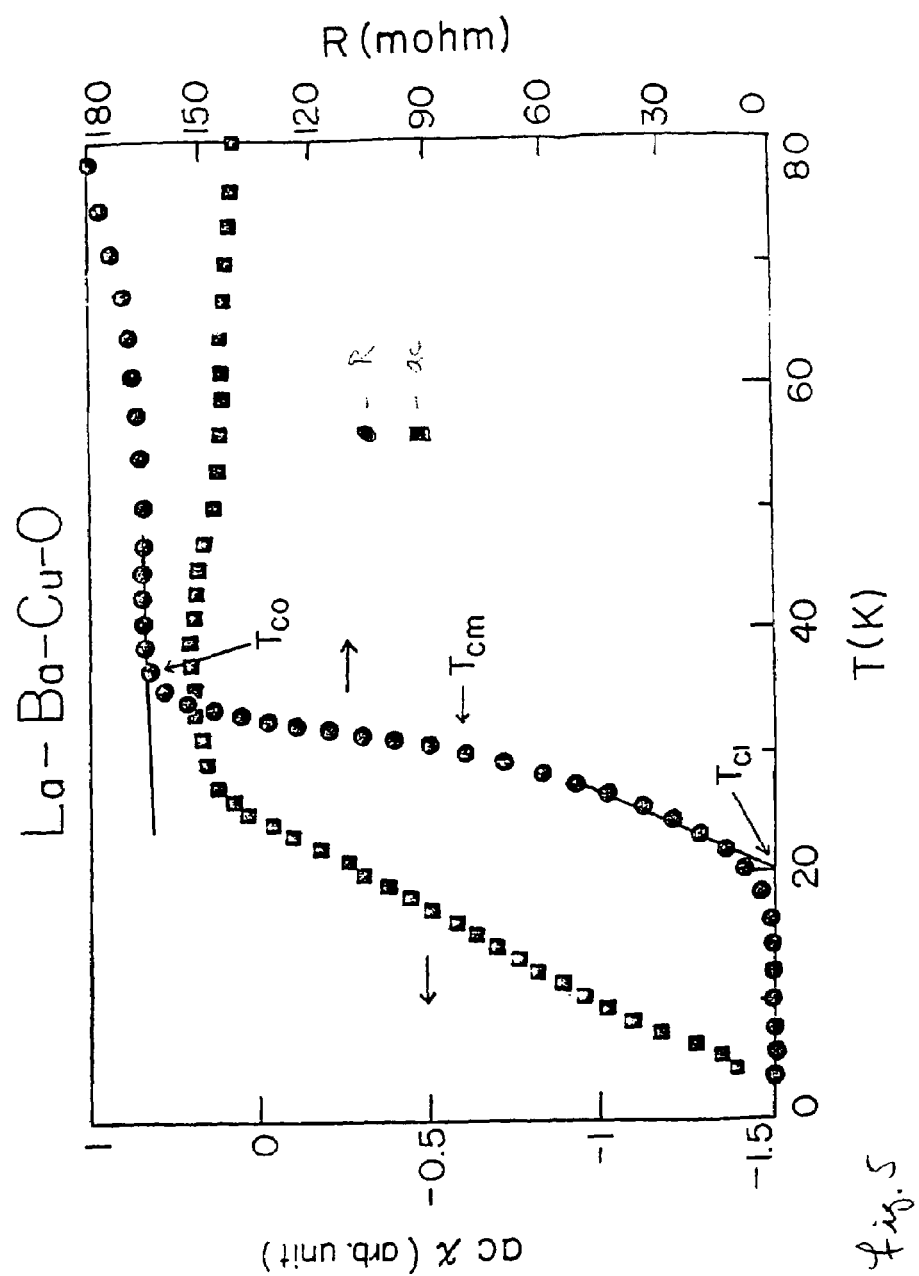
FIG. 5 illustrates the resistivity and diamagnetic shift as a function of temperature of a La—Ba—Cu—O composition prepared according to Example III.
Figure 6:
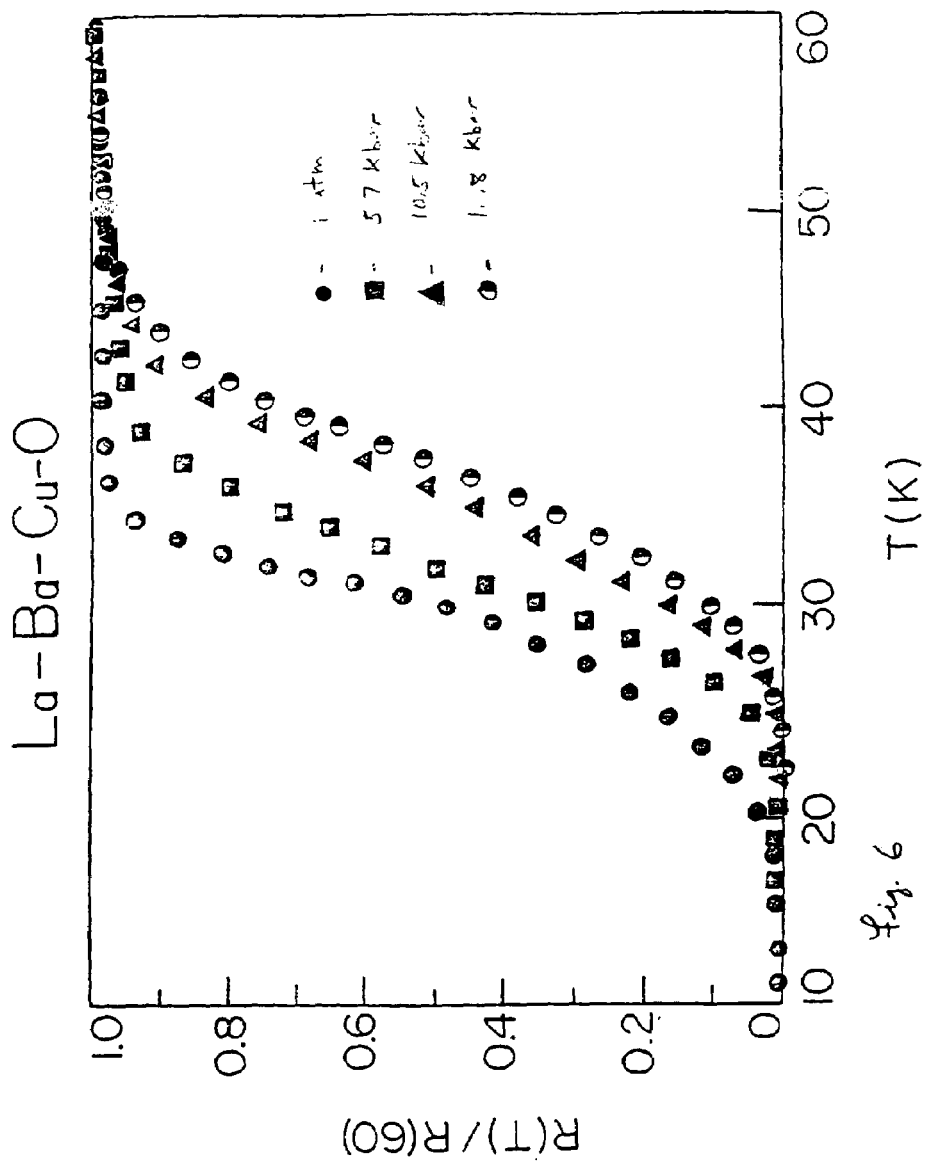
FIG. 6 illustrates the resistivity as a function of temperature under different applied pressures of 5.7 kilobars, 10.5 kilobars and 16.8 kilobars of a La—Ba—Cu—O composition as prepared according to Example III.
Figure 7:
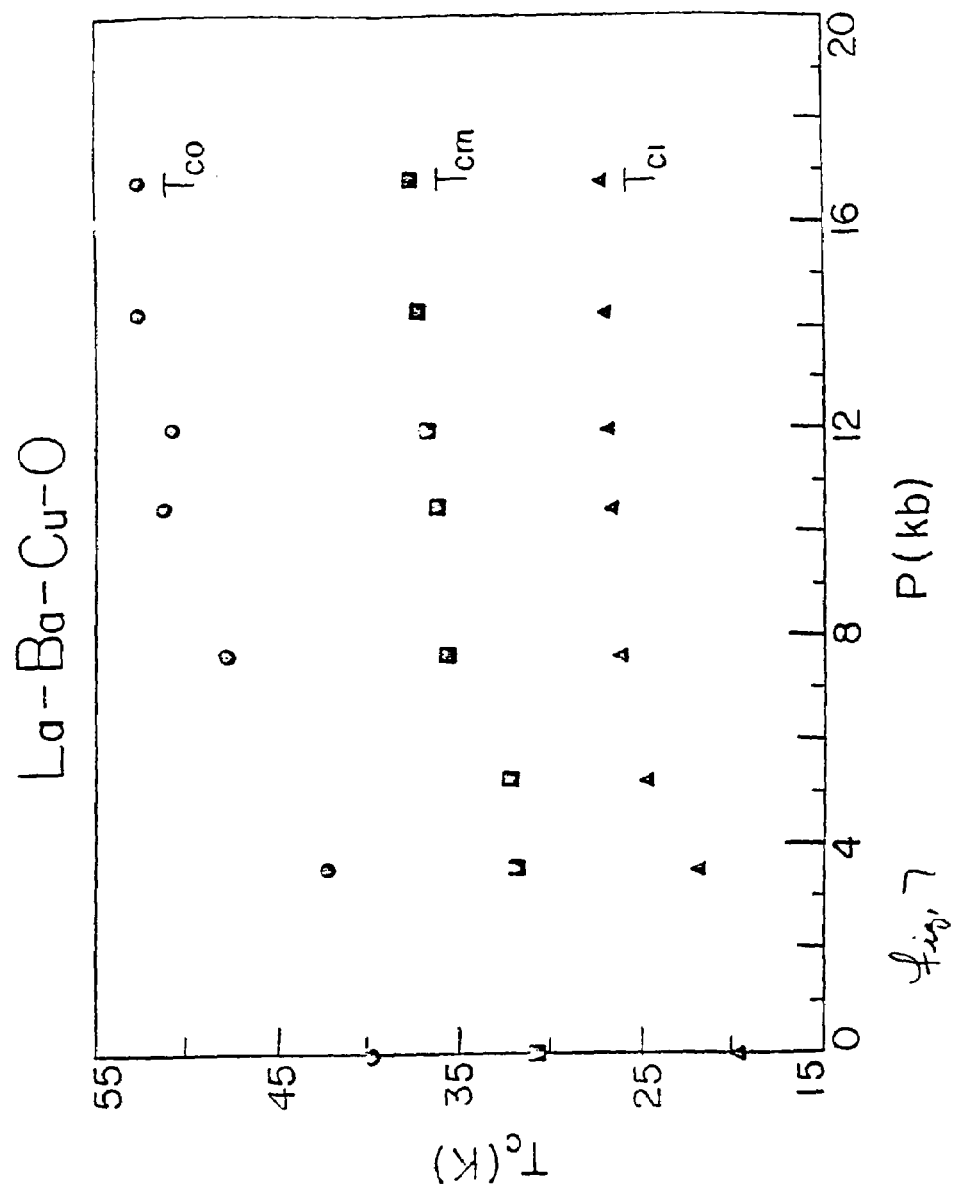
FIG. 7 illustrates the effect of applied pressure on onset temperatures ($T_{C0}$), midpoint temperature ($T_{cm}$) and temperature for complete superconductivity ($T_{C1}$) of a La—Ba—Cu—O composition prepared according to Example III.

A sample prepared as described above exhibits only X-ray powder diffraction patterns characteristic of the single $K_2NiF_4$ phase with a resolution ~5%. The resistivity of this sample at ambient pressure decreases monotonically with decreasing temperature but at a reduced rate below 60° K. A large drop in resistivity sets in at ~39° K, indicative of the onset of a superconducting transition, and resistivity becomes zero at $T_{cl}$~20° K as shown in FIG. 5. Preliminary ac $\chi$-measurement showed diamagnetic shift starting at ~32° K and reaching a maximum of 10% of the signal of a superconducting Pb sample of a similar size. Under applied pressure, the superconducting transition is broadened but with an overall shift toward higher temperatures as shown in FIG. 6. $T_{C1}$ has been enhanced from 39° to 52.5° K and the $T_{cl}$ from 20° to 25° K by application of a pressure of 12 kilobars as displayed in FIG. 7. The enhancement rate of $T_{co}$ and $T_{cl}$ is significantly reduced above 12 kilobars. The pressure effect on the midpoint temperature $T_{cm}$ where it has dropped by 50% of that at $T_{co}$ is also given in FIG. 7.

$T_{cm}$ increases from 31° to 36° K under pressure. The decrease in the rate of $T_{co}$ enhancement at 12 kilobars is accompanied by an overall resistivity increase at about $T_{co}$, indicating the possible commencement of physical or chemical instabilities. Serious deterioration of samples is also detected upon removal of pressure, as evidenced by the dramatic increase in resistivity and a semiconducting behavior at low temperatures preceded by a drop in resistivity starting at $T_{co}$. The exact causes and remedy for the pressure induced sample deterioration above ~12 kilobars are currently under study.

One method of preparing the composition of this example in a wire form, while simultaneously reducing the interatomic distances between the atoms in the material, may include performing these reaction steps while $La_2O_3$ or $La(OH)_3$, $BaCO_3$ and CuO have been placed in a copper sleeve, or placing the reaction product of this mixture directly in the sleeve followed by drawing or extrusion. Because of the relative thermal expansion coefficients of the copper compared to the superconducting composition, the resulting lanthanum-barium-copper-oxide would be compressed by the walls of the copper sleeve. This compression will cause the $T_C$ of the material within the copper sleeve (the copper sleeve itself is not part of the superconductive material) to increase.

EXAMPLE IV 2.0 grams of $La_2O_3$, 0.2 grams of $BaCO_3$ and 0.53 grams of CuO were mixed mechanically in a mortar-pestle apparatus for approximately 3 hours. The resulting mixture was then compressed into pellets by applying a pressure of about 2 kilobars. The pellets were heated to about 1000° C., and allowed to react for about twenty-four hours in air. The reacted pellets were then quenched rapidly to room temperature.

The La—Ba—Cu—O composition produced from this process corresponds to the formula $[L_{1-x}Ba_x]_aCu_bO_y$, wherein "x" is 0.075, "a" is 2, "b" is 1 and "y" is 2 to 4. The oxide complex of this example showed superconductive properties at a temperature of 36° K at atmospheric pressure.

EXAMPLE V 4.9 grams of $La_2O_3$, 1.1 grams of $BaCO_3$ and 2.8 grams of CuO were mixed in a mortar-pestle for 3 hours. The mixture was then heated in oxygen at a pressure of 15 microns Hg, until it reached a temperature of about 720° C. The temperature was increased at a rate of about 1° C. per minute. The mixture was then allowed to react for about an hour at about 720° C. After this reaction, the temperature was raised to a temperature of about 925° C., this raise in temperature was made at a rate of about 30° C. per minute. Once at this temperature, the samples were maintained at this temperature for about twenty-one hours. After this period, the mixture was cooled to room temperature and then the reacted mixture was pulverized until the sample was homogenized. The pulverized mixture was then heated rapidly to a temperature of about 925° C., and kept at that temperature for about seven hours. After this period, the mixture was compressed with a pressure of six kilobars. This compression converted the mixed powder into pellets. The pellets were then sintered into solid cylinders by heating them at a temperature of about 925° C. for a period of about four hours at ambient pressure. Finally, the sample was rapidly quenched from this temperature to room temperature in air. The oxide complex so formed corresponds to the general formula $[La_{1-x}Ba_x]_aCu_bO_y$, wherein "x" is 0.15, "a" is 1, "b" is 1 and "y" is 2 to 4.

The resulting lanthanum-barium-copper-oxide composition, superconducting at 32° K at ambient pressure, was then placed under a pressure of 9 kilobars using a Be—Cu high pressure clamp using a fluid pressure medium. Pressure was measured using a superconducting Pb—manometer situated next to the sample at room temperature. As this compressed composition was cooled, it began showing superconductivity properties at a temperature of 40.2° K.

Figure 2:
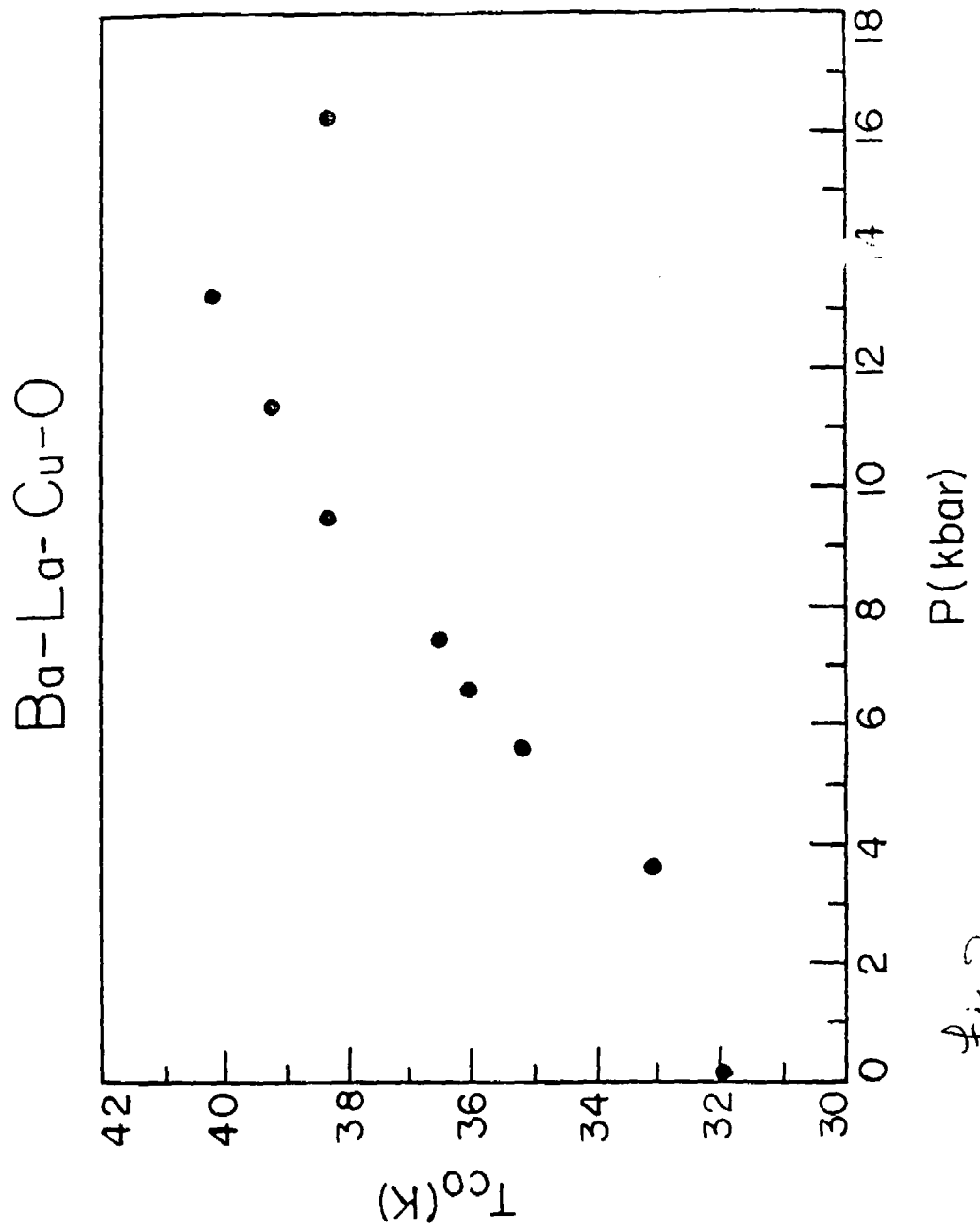
FIG. 2 illustrates the enhancement towards higher temperatures of the onset transition temperature ($T_{C0}$) as applied pressure is increased upon a La—Ba—Cu—O composition as prepared according to Example V.

Powder X-ray diffraction patterns at room temperature showed that the sample was multiphased, consisting predominantly of $K_2NiF_4$ (~90%) and unidentified phases (<10%). Under applied pressures, resistivity at 300° K is suppressed and the drop in resistivity is broadened slightly, but with an overall shift toward higher temperature as shown in FIG. 1. $T_{co}$ increases rapidly with pressures as shown in FIG. 2. At 13 kilobars, $T_{CO}$ is ~40.2° K. Under pressure, $T_{co}$ increases from 32° to 40.2° K at 13 kilobars at a rate ~0.9× $10^{-3}$° K bar$^{-1}$. Above 13 kilobars, the sample was damaged due to a shear strain introduced accidentally by applying pressure below −20° C., as evidenced by the appearance of a rapid resistivity increase following the resistivity drop at $T_{co}$ on cooling and the irreversibility of resistivity after the pressure was reduced.

Figure 3:
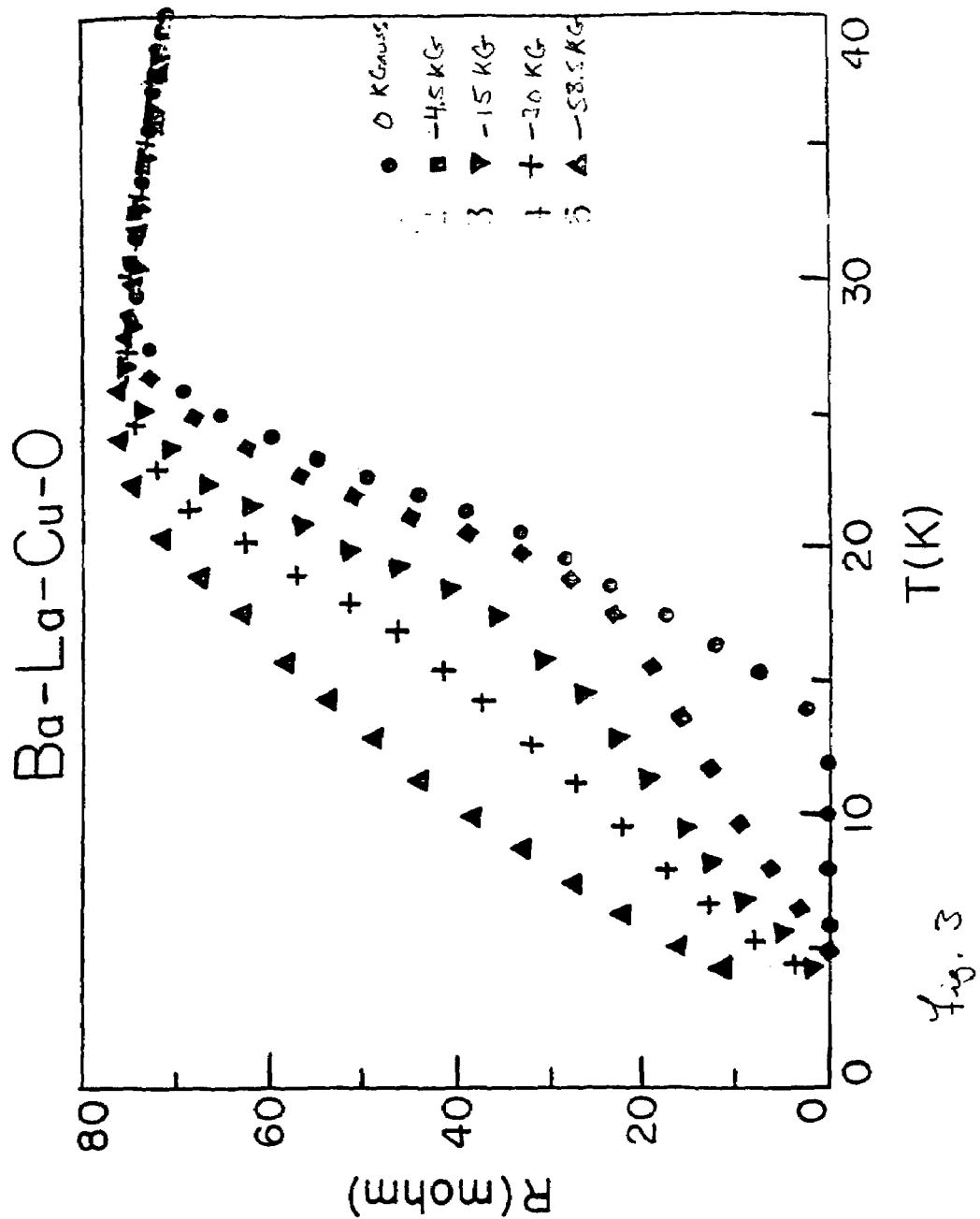
FIG. 3 illustrates the magnetic field effect on resistivity of a La—Ba—Cu—O composition as prepared according to Example V.
Figure 4:
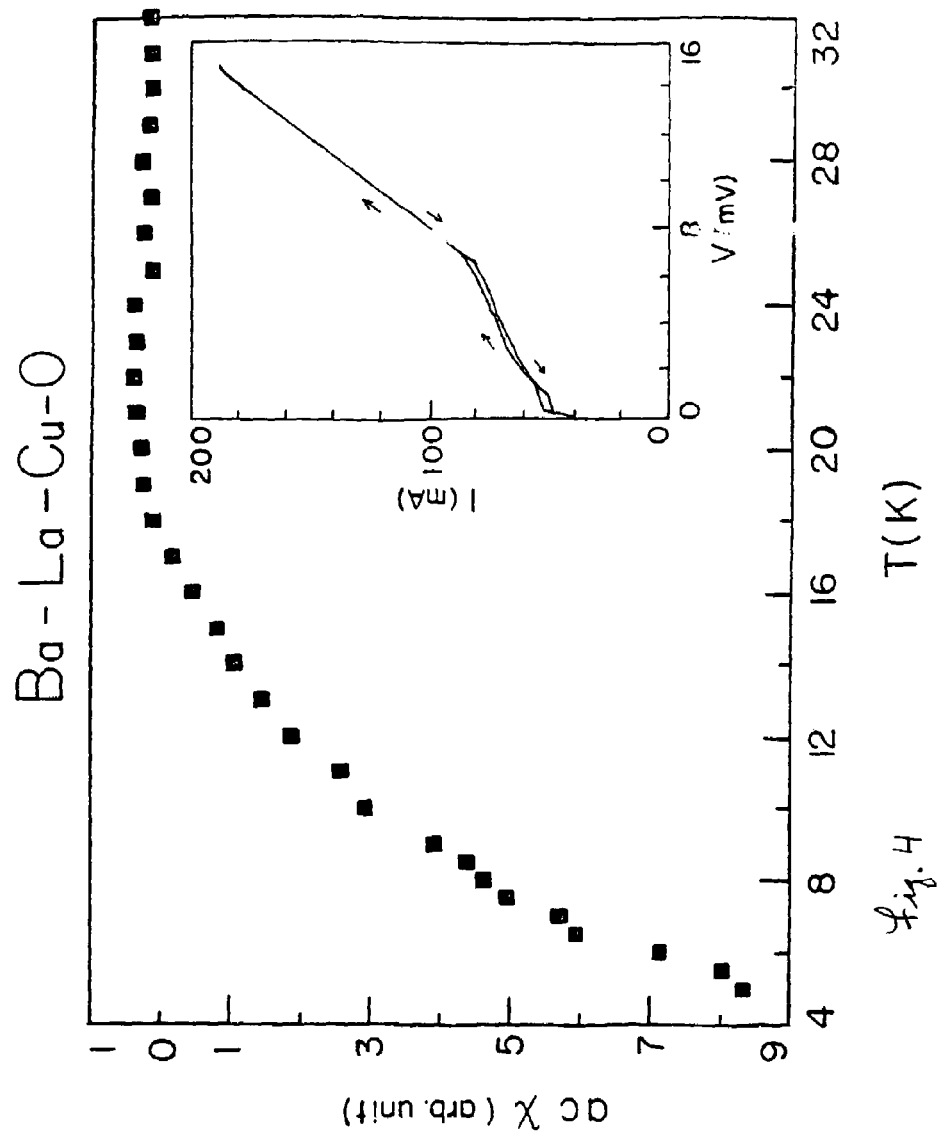
FIG. 4 illustrates the magnetic susceptibility as a function of temperature of a La—Ba—Cu—O composition as prepared according to Example V.

FIG. 3 displays the magnetic field effect on resistivity as a function of temperature. It is clear that the rapid resistivity drop is suppressed and the zero resistivity state at 4° K can be destroyed by magnetic fields. Below 18° K, a diamagnetic shift is clearly evident and reaches a maximum of 2% of the signal of a superconducting Pb sample of the same size as shown in FIG. 4. The insert of FIG. 4 shows the current-voltage characteristics for the sample at 4.2° K. The zero resistivity state is removed as current exceeds a critical value which increases with decreasing temperature. All these strongly demonstrate that the resistivity drop is associated with a superconducting transition.

EXAMPLE VI 6.0 grams of $La_2O_3$, 0.61 grams of $SrCO_3$ and 1.63 grams CuO were mixed mechanically in a mortar-pestle for approximately 3 hours. The resulting mixture was then compressed into pellets by applying a pressure of about 3 kilobars. The pellets were heated to about 1000° C., and allowed to react for about twenty-four hours in air. The reacted pellets were then quenched rapidly to room temperature.

The La—Sr—Cu—O composition produced from this process corresponds to the general formula $[La_{1-x}Sr_x]_aCu_bO_y$ where "x" is 0.1, "a" is 2, "b" is 1, and "y" is 2 to 4. The oxide complex was placed under a pressure of 16 kilobars, at room temperature. Upon cooling this oxide complex composition showed superconducting properties at a temperature of 42° K at atmospheric pressure. The oxide complex composition under a pressure of 16 kilobars showed superconducting properties at 54° K.

EXAMPLE VII

The magnetic layer in a superconducting-magnetic-superconducting multi-layer device could consist of a lanthanum-barium-copper-oxide base composition. Such a composition may be prepared as follows.

3.0 grams $La_2O_3$, 3.6 grams $BaCO_3$ and 2.9 grams CuO were mixed and heated in a vacuum about $10^{-4}$ microns Hg at a temperature of about 1000° C. for about twenty-four hours. The resulting product formed a magnetic compound with a magnetic ordering temperature below 40° K.

The superconducting-magnetic-superconducting multi-layer structures may therefore be formed by subjecting the overlayer of La—Ba—Cu—O, which is separated from the superconducting underlayer by an ultra-thin protective covering of, for example $SiO_2$, to a vacuum of $10^{-4}$ microns Hg at a temperature of between about 900° C. and 1100° C.

Thin film samples of the composition of the present invention may be synthesized by alternative current or radio frequency sputtering of a sintered La—Ba—Cu—O target in an argon atmosphere having about 10% oxygen and a pressure of between $10^{-2}$ and 2 microns Hg. Heat treatment of such film samples at 15-2000 microns Hg pressure in an oxygen atmosphere should make the superconducting properties of the film samples similar to those for the sintered samples.

EXAMPLE VIII

A La—Ba—Cu—O composition was prepared in accordance with the procedure described in Example II except that $La_2O_3$, $BaCO_3$ and CuO were used in the amounts appropriate to provide an oxide complex of the formula $[La_{1-x}Ba_x]_aCu_bO_y$, wherein "x" is 0.1, "a" is 2, "b" is 1 and "y" is between 3 and 4, and an intensive mixer ball mill was used rather than a jar mill. The oxide complex so produced showed superconductive properties at a temperature of 60° K at an applied pressure of 12 kilobars.

EXAMPLE IX

A La—A(trace)-Cu—O composition was prepared in accordance with the procedure described in Example II except that $La_2O_3$, $ACO_3$ and CuO were used in the amounts appropriate to provide an oxide complex of the formula $[La_{1-x}Ba_x]Cu_bO_y$, wherein "x" is about 0.01, "a" is 2, "b" is 1 and "y" is between 3 and 4, and an intensive mixer ball mill was used for mixing rather than a jar mill. "A" was either barium or strontium. The oxide complex so produced showed superconductive properties at an onset temperature of 100° K at 1 atmosphere.

EXAMPLE X

A La—Ba—Cu—O composition was prepared in accordance with the procedure of Example II except that $La_2O_3$, $BaCO_3$ and CuO were used in the amounts appropriate to provide an oxide complex of the formula $[La_{1-x}Ba_x]_aCu_bO_y$, wherein "x" is about 0.4, "a" is 1, "b" is 1 and "y" is between 2 and 3, and the heat treatment was done at $10^{-4}$ microns Hg in air, rather than at atmospheric pressure. The oxide complex so produced showed superconductive properties at an onset temperature of 100° K.

EXAMPLE XI

An yttrium oxide complex was prepared with a nominal composition represented by $(Y_{1-x}Ba_x)_aCu_bO_y$, wherein "x" is 0.4, "a" is 2, "b" is 1 and Y is less than or equal to 4. The yttrium oxide complex was prepared by intensively mixing appropriate amounts of $Y_2O_3$, $BaCo_3$ and CuO. The oxide mixture was then compressed to pellets at an applied pressure of 100 to 500 psi, the resulting pellets were then heated in air at a temperature between 900 to 1100° C. for about 15 minutes then rapidly quenched to room temperature in air.

Bar samples of dimensions 1 mm×0.5 mm×4 mm were cut from the sintered cylinders. A four-lead technique was employed for the resistance (R) measurements and an ac inductance bridge for the magnetic susceptibility (X) determinations.

Figure 8:
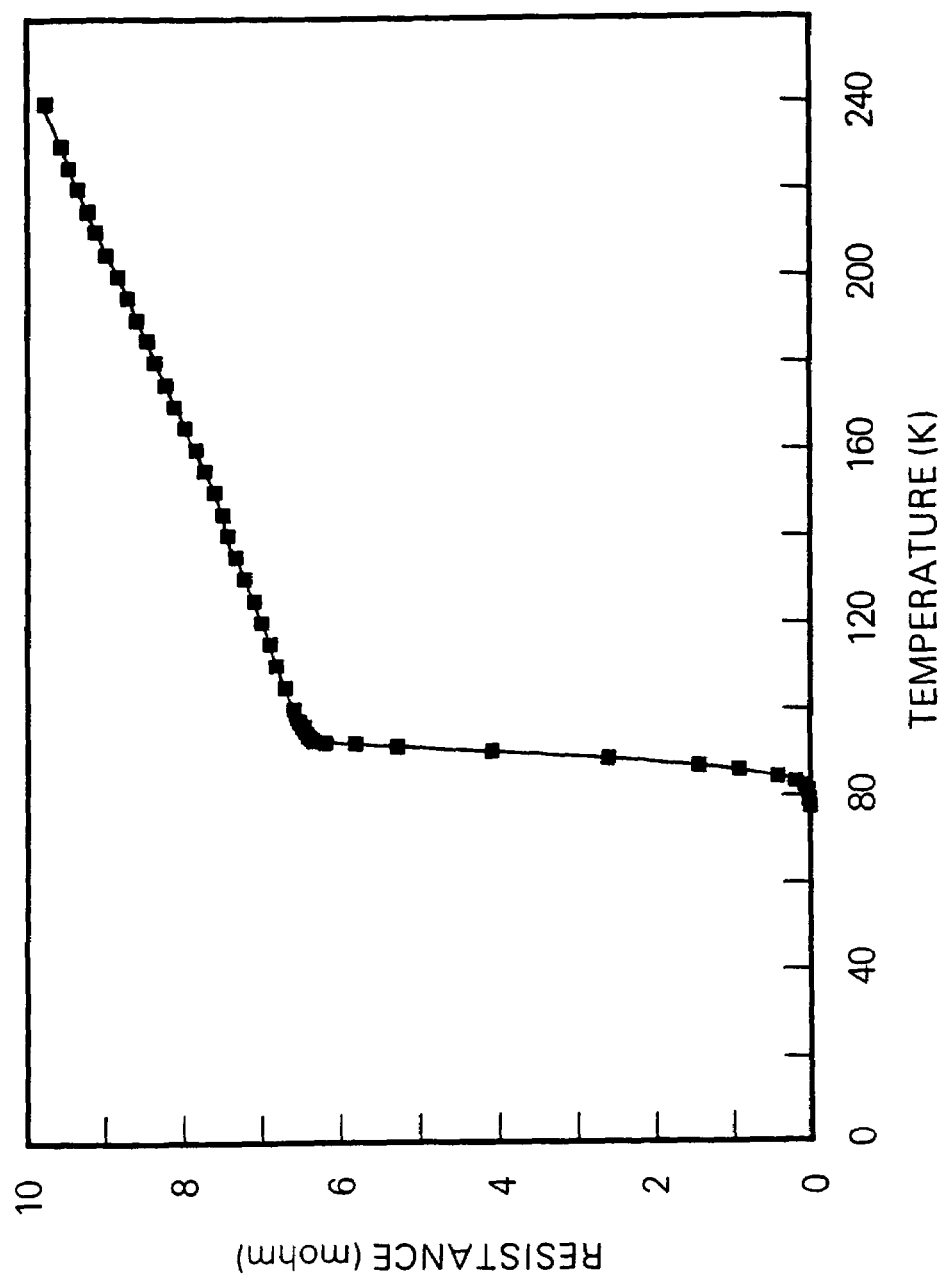
FIG. 8 illustrates the reduction in electrical resistance as temperature is decreased of a Y—Ba—Cu—O composition as prepared according to Example XI.
Figure 9:
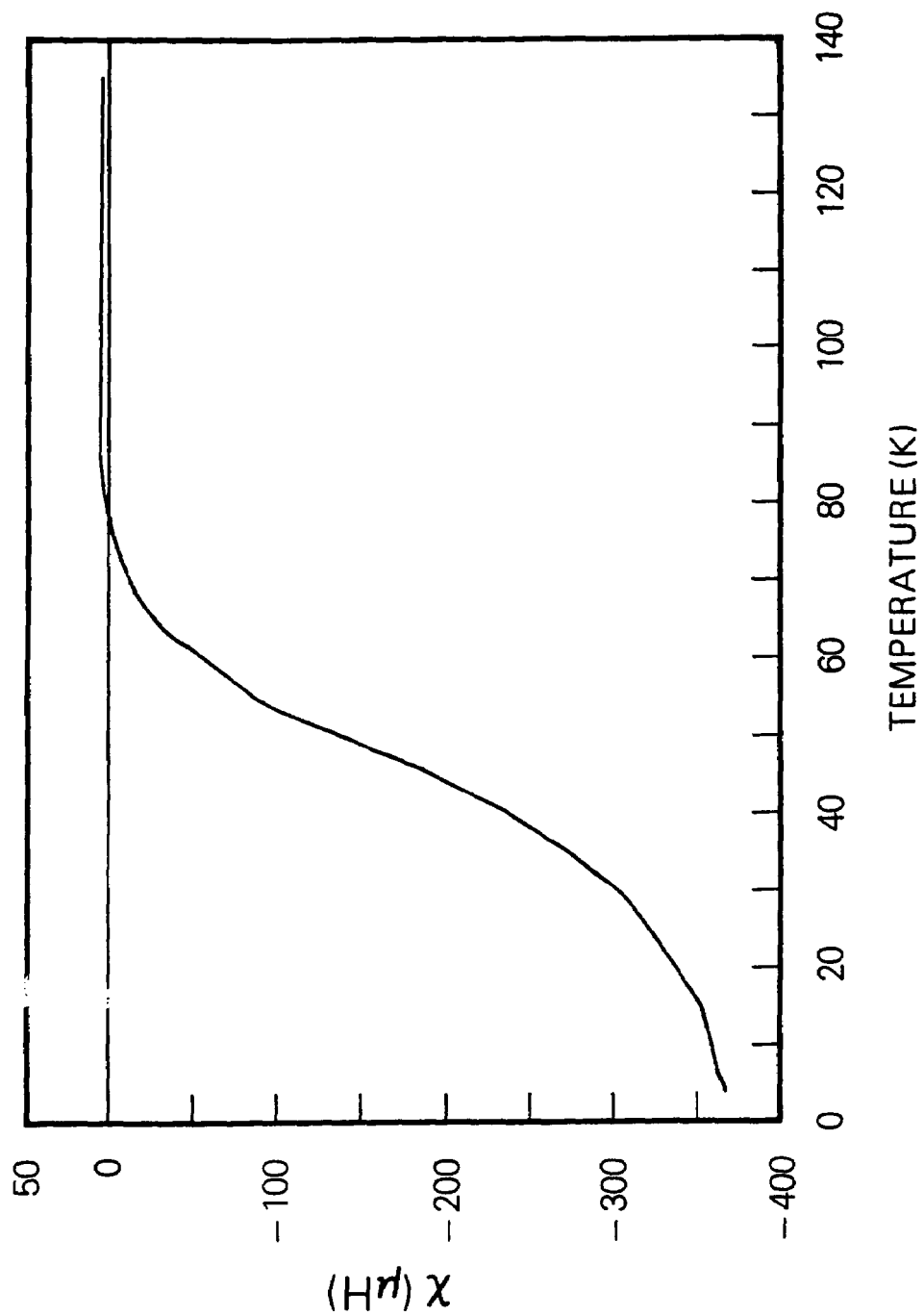
FIG. 9 illustrates the temperature dependence of magnetic susceptibility of a Y—Ba—Cu—O composition as prepared according to Example XI.
Figure 10:
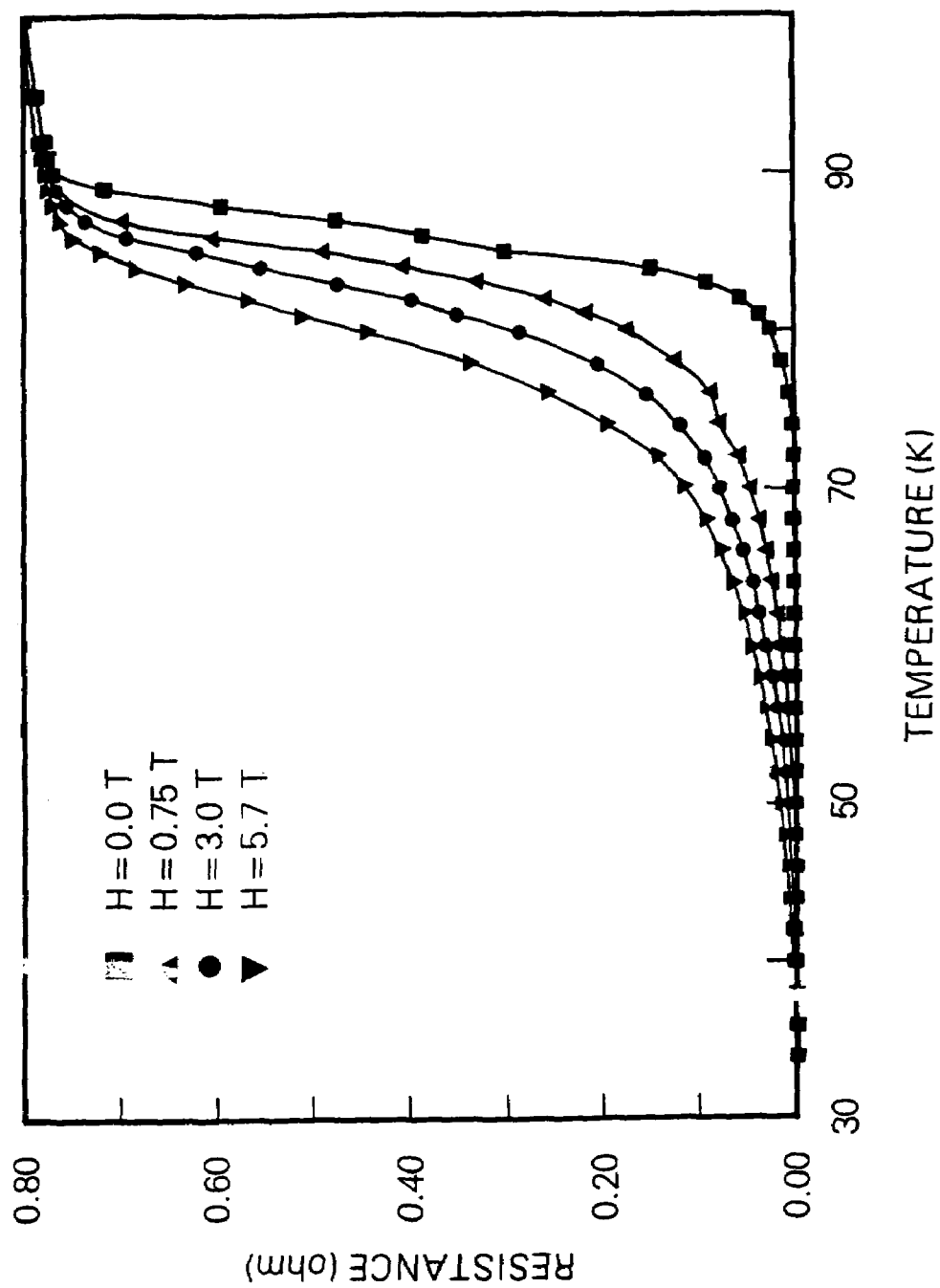
FIG. 10 illustrates the magnetic field effect on the resistance of a Y—Ba—Cu—O composition as prepared according to Example XI.

The temperature dependence of resistance for this Y—Ba—Cu—O oxide complex was determined in a simple liquid nitrogen dewar with results as shown in FIG. 8. Resistance (R) initially dropped linearly with temperature (T). A deviation of resistance from the linear temperature dependence was evidenced at 93° K. A zero resistivity state was achieved at 80° K. (However, when the pellets were quenched on an aluminum plate as a heat sink to room temperature in air, the zero resistance state was achieved at 90° K.) The variation of magnetic susceptibility ($\chi$) with temperature was measured with the results as shown in FIG. 9. A diamagnetic shift was observed to start at 91° K and the size of the shift increased rapidly with further cooling. At 4.2° K, the diamagnetic signal corresponded to 24% of the superconducting signal of a lead sample with similar dimensions. In a magnetic field, the drop in resistivity shifted toward lower temperature as shown in FIG. 10. At the maximum field applied, the zero resistivity state remained at temperature as high as 40° K. Preliminary X-ray powder diffraction patterns showed the existence of multiple phases apparently uncharacteristic of the $K_2NiF_4$-structure in the samples.

The above results demonstrate unambiguously that superconductivity occurs in the Y—Ba—Cu—O oxide complex with a transition between 80 and 93° K (and 90-93° K when quenched on the aluminum plate). The upper critical field $H_{c2}(T)$ was determined resistively. If the positive curvature at very low fields is neglected, a value of $dH_{c2}/dT$ near $T_c$ is observed to be the 3T/K or 1.3T/K, depending on if $H_{c2}(T_c)$ is taken at the 10% drop of the normal state resistivity, or the 50% drop. In the weak-coupling limit, $H_{c2}(0)$ was estimated as between 80 and 180T in the Y—Ba—Cu—O oxide complex. The paramagnetic limiting field to 0° K for a sample with a $T_c$~90K is 165T.

As is readily apparent from the above description, additional advantages and modifications will readily occur to those skilled in the art. The invention in its broader aspects is therefore not limited to the specific examples shown and described. Accordingly, departures may be made from the details shown in the examples without departing from the spirit or scope of the disclosed general inventive concept.

I claim:

1. A composition of matter comprising a Y—Ba—Cu—O complex of nominal formula:
    $(Y_{1-x}Ba_x)_a Cu_b O_y$, wherein "x" is about 0.01 to 0.5, "a" is about 1 to 2, "b" is 1, and "y" is about 2 to about 4, containing a superconductive crystalline phase consisting essentially of Y, Ba, Cu and O which has zero electrical resistance at 77° K or above, said superconductive crystalline phase having a crystal structure uncharacteristic of that of a $K_2NiF_4$ crystal structure, and said superconductive crystalline phase being present in said composition of matter in a quantity sufficient to provide the composition with a diamagnetic signal at 4.2° K corresponding to at least 24% of the superconducting signal of a lead sample with similar dimensions.

2. A composition of matter comprising a Y—Ba—Cu—O complex of nominal formula:
    $(Y_{1-x}Ba_x)_a Cu_b O_y$, wherein "x" is 0.4, "a" is 2, "b" is 1, and "y" is about 2 to about 4, containing a superconductive crystalline phase consisting essentially of Y, Ba, Cu and O which has zero electrical resistance at 77° K or above, said superconductive crystalline phase having a crystal structure uncharacteristic of that of a $K_2NiF_4$ crystal structure, and said superconductive crystalline phase being present in said composition of matter in a quantity sufficient to provide the composition with a diamagnetic signal at 4.2° K corresponding to about 24% of the superconducting signal of a lead sample with similar dimensions.

3. A method for conducting an electrical current without electrical resistive losses, comprising the steps of:
    utilizing as a conductor a composition of matter comprising a Y—Ba—Cu—0 complex of nominal formula $(Y_{1-x}Ba_x)_a Cu_b O_y$, wherein "x" is about 0.01 to 0.5, "a" is about 1 to 2, "b" is 1, and "y" is about 2 to about 4, containing a superconductive crystalline phase consisting essentially of Y, Ba, Cu and O which has zero electrical resistance at 77° K or above, said superconductive crystalline phase having a crystal structure uncharacteristic of that of a $K_2NiF_4$ crystal structure, and said superconductive crystalline phase being present in said composition of matter in a quantity sufficient to provide the composition with a diamagnetic signal at 4.2° K corresponding to at least 24% of the superconducting signal of a lead sample with similar dimensions;
    cooling said composition of matter to a temperature at or below that at which said crystalline phase becomes superconductive; and
    initiating a flow of electrical current within said composition of matter while maintaining said composition of matter at or below the temperature at which said crystalline phase becomes superconductive.

4. A method for conducting an electrical current without electrical resistive losses, comprising the steps of:
    utilizing as a conductor a composition of matter comprising a Y—Ba—Cu—O complex of nominal formula $(Y_{1-x}Ba_x)_3 Cu_b O_y$, wherein "x" is 0.4, "a" is 2, "b" is 1, and "y" is about 2 to about 4, containing a superconductive crystalline phase consisting essentially of Y, Ba, Cu and O which has zero electrical resistance at 77° K or above, said superconductive crystalline phase having a crystal structure uncharacteristic of that of a $K_2NiF_4$ crystal structure, and said superconductive crystalline phase being present in said composition of matter in a quantity sufficient to provide the composition with a diamagnetic signal at 4.2° K corresponding to about 24% of the superconducting signal of a lead sample with similar dimensions;
    cooling said composition of matter to a temperature at or below that at which said crystalline phase becomes superconductive; and
    initiating a flow of electrical current within said composition of matter while maintaining said composition of matter at or below the temperature at which said crystalline phase becomes superconductive.

5. A superconducting composition exhibiting zero electrical resistance at a temperature of 40° K or above of having the nominal formula $$[Y_{1-x}Ba_x]_a Cu_b O_y$$

wherein x is 0.4, a is 2, b is 1, and y is 2 to 4.

6. The superconducting composition of claim 5 wherein the composition exhibits zero electrical resistance at a temperature of 77° K or above.

7. The superconducting composition of claim 5 wherein said composition has a crystal structure uncharacteristic of that of a $K_2NiF_4$ crystal structure.

8. A superconducting composition exhibiting zero electrical resistance at a temperature of 77° K or above having the nominal formula:

$$Y_a Ba_b Cu_c O_x$$

wherein "a" is about 1.2, "b" is about 0.8, "c" is about 1.0, and "x" is about 2 to 4.

* * * * *

UNITED STATES PATENT AND TRADEMARK OFFICE
CERTIFICATE OF CORRECTION

PATENT NO.         : 7,709,418 B1
APPLICATION NO.    : 07/300063
DATED              : May 4, 2010
INVENTOR(S)        : Ching-Wu Chu It is certified that error appears in the above-identified patent and that said Letters Patent is hereby corrected as shown below:

In the claims:

Claim 4 (column 14, line 20) the formula reading "$(Y_{1-x}Ba_x)_3Cu_bO_y$," should read $(Y_{1-x}Ba_x)_aCu_bO_y$ Signed and Sealed this
Eighth Day of May, 2012

David J. Kappos
*Director of the United States Patent and Trademark Office*